United States Patent [19]

Ishii et al.

[11] Patent Number: 5,112,771

[45] Date of Patent: May 12, 1992

[54] METHOD OF FIBRICATING A SEMICONDUCTOR DEVICE HAVING A TRENCH

[75] Inventors: Tatsuya Ishii; Yoji Mashiko; Masao Nagatomo; Michihiro Yamada, all of Hyogo, Japan

[73] Assignee: Mitsubishi Denki Kabushiki Kaisha, Tokyo, Japan

[21] Appl. No.: 349,737

[22] Filed: Jun. 12, 1989

Related U.S. Application Data

[62] Division of Ser. No. 167,792, Mar. 14, 1988, abandoned.

[30] Foreign Application Priority Data

Mar. 20, 1987 [JP] Japan ............................ 2-66257
Jul. 21, 1987 [JP] Japan ............................ 62-182703

[51] Int. Cl.⁵ ............................................ H01L 21/76
[52] U.S. Cl. ........................................ 437/67; 437/52
[58] Field of Search ................................. 437/52, 67

[56] References Cited

U.S. PATENT DOCUMENTS 4,845,048 7/1989 Tamaki et al. ...................... 437/62

FOREIGN PATENT DOCUMENTS 0044400 of 1982 European Pat. Off. .
3542321 of 1986 Fed. Rep. of Germany .
59-232437 12/1984 Japan .................................. 437/67
60-245144 12/1985 Japan .................................. 437/67
61-201444 9/1986 Japan .................................. 437/67
61-287143 12/1986 Japan .................................. 437/67

OTHER PUBLICATIONS

IEE Proceedings, vol. 134, Pt. I, No. 1, Feb. 1987.

Primary Examiner—Olik Chaudhuri
Assistant Examiner—G. Fourson
Attorney, Agent, or Firm—Lowe, Price, LeBlanc and Becker

[57] ABSTRACT

A semiconductor device having a trench (30) comprises a semiconductor substrate (11), a plurality of elements (13) provided on the semiconductor substrate, a trench (30) provided between the elements and an insulating material (12) embedded in the trench for isolating the elements. The trench has its bottom portion region enlarged in both sides.

The semiconductor device is manufactured by enlarging the bottom portion region of the trench by etching.

6 Claims, 8 Drawing Sheets

METHOD OF FIBRICATING A SEMICONDUCTOR DEVICE HAVING A TRENCH

This is a division, of application Ser. No. 07/167,792, filed Mar. 14, 1988, now abandoned.

BACKGROUND OF THE INVENTION

1. Field of the Invention

The present invention generally relates to a semiconductor device having a trench and, more specifically, it relates to a semiconductor device having a trench used for isolating elements and a method for making the same.

2. Description of the Prior Art

A conventional semiconductor device having a trench, for example a dynamic type semiconductor memory device, is shown in FIG. 1.

FIG. 1 is a cross sectional view showing a conventional semiconductor memory device having a so-called trench isolation, in which a silicon oxide film is filled in the trench formed in the semiconductor substrate so as to form a region for isolating elements. MIS (Metal Insulator Semiconductor) type random access memory device having the structure of one transistor.one capacitor.

Referring to FIG. 1, a trench 70 is formed on a prescribed portion of the silicon substrate 51. A silicon oxide film, which is an insulating film, is filled in the trench 70 so as to make a trench isolating portion 52 for isolating elements. An impurity diffusion layer 53 is formed on the surface of the silicon substrate 51 adjacent to the trench 70 by photolithography, ion implantation, etc. In addition, a capacitor plate electrode 54 for storing charge representing information formed of a conductive policrystalline silicon is arranged above the impurity diffusion layer 53 with a dielectric film 56 interposed therebetween. A capacitor is constituted by the junction capacitance of the impurity diffusion layer 53, the capacitor plate electrode 54 and the silicon substrate 51.

On the surface region of the silicon substrate 51 adjacent to the impurity diffusion layer 53, a transfer gate electrode 55 formed of a conductive polycrystalline silicon is arranged with dielectric film 56 interposed therebetween. The transfer gate electrode 55 constitutes the MOS transistor which supplies and discharges the charges in and from the capacitor.

In addition, an impurity diffusion layer 57 is formed on the surface region of the silicon substrate 51 which is adjacent to the transfer gate electrode 55. A metal wiring 58 formed of aluminum or the like, which transmits the charge representing information to the said MOS transistor, is connected to the impurity diffusion layer 57. An interlayer insulating film 59 formed of silicon oxide film is formed between the metal wiring 58, and the capacitor plate electrode 54 and the transfer gate electrode 55 and, a surface protection film 60 formed of silicon nitride film is formed as the uppermost layer.

In the semiconductor memory device, the charge representing information stored in the impurity diffusion layer 53 is transmitted to the metal wiring 58 through an inversion region formed in the region below the transfer gate electrode 55. The charge representing information transmitted through the metal wiring 58 is supplied to the impurity diffusion layer 53 through the said inversion region.

Meanwhile, as for the semiconductor memory device shown in FIG. 1, another structure has been already known in which the capacitor region is extended to the side wall portion of the trench 70.

In the semiconductor memory device, $\alpha$ rays irradiated from the package or the like sometimes enters the silicon substrate 51, generating carriers in the silicon substrate 51.

In the above described conventional semiconductor memory device, these carriers are collected in the impurity diffusion layer 53 where the charges representing information are stored, causing malfunction of the semiconductor substrate, inducing so-called soft errors.

As an another prior art, a peripheral capacitor cell with fully recessed isolation for megabit DRAM is disclosed in Extended Abstracts of the 18th (1986 International) Conference on Solid State Devices and Materials (Tokyo, 1986, pp. 295 to 298). In this article, a concept of making a semiconductor memory device having a capacitor on the side surface of the trench is disclosed in which a nitride film and an oxide film are formed on the surface of the trench and the nitride film is left only on the side surface of the trench by anisotropic etching.

SUMMARY OF THE INVENTION

An object of the present invention is to provide a semiconductor memory device which avoids malfunctions due to the carriers and is stable against soft errors induced by $\alpha$ rays.

Another object of the present invention is to provide a method for manufacturing a semiconductor memory device which is capable of attaining the above described object in which only the bottom region of the trench can be enlarged in both sides.

A semiconductor memory device having a trench in accordance with the present invention comprises a semiconductor substrate, a plurality of elements provided on the semiconductor substrate, a trench provided on said semiconductor substrate between elements and an insulating material filled in said trench for isolating elements. The region on the bottom portion of said trench is enlarged in both sides.

An insulating material is filled in the whole trench, for example. The said device is, for example, a capacitor.

A method for manufacturing a semiconductor device having a trench in accordance with the present invention comprises the steps of forming a first silicon oxide film on the semiconductor substrate, forming a trench on the semiconductor substrate by etching with the silicon oxide film used as an etching mask, forming a second silicon oxide film on the entire exposed surface of the semiconductor substrate with the silicon oxide film serving as the etching mask being left as it is, anisotropically etching the formed silicon oxide film to leave the silicon oxide film only on the side wall of the trench, and enlarging the trench for enlarging the width of the bottom portion of the trench by etching the semiconductor substrate which is exposed only by the isotropic etching process only on the bottom surface of the trench. The trench enlarging step is carried out by, for example, isotropic etching. The said manufacturing method may further comprise the step of forming a region for isolation, in which an insulating material such as silicon oxide film or polycrystalline silicon is filled in the space in the trench so as to form a region for isolating elements.

The semiconductor device is, for example, a dynamic type semiconductor memory device. The dynamic type semiconductor memory device is, for example, a metal insulator semiconductor type random access memory device having one transistor.one capacitor structure.

In the semiconductor device in accordance with the present invention, by enlarging the width of the region in the bottom portion of the trench for isolating elements wider than other portions, the region for isolating elements serves as a barrier layer against carriers generated by a α rays in the semiconductor substrate, preventing the collection of said carriers in the active region formed on the surface of the semiconductor substrate.

In addition, according to a manufacturing method of the semiconductor substrate in accordance with the present invention, a semiconductor device can be provided in which only the region in the bottom portion of the trench is enlarged in both sides.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

A dynamic type semiconductor memory device is an example of the semiconductor device formed on a semiconductor substrate with a trench. In the following, a description will be given of this dynamic type semiconductor memory device, namely, a MIS type random access memory device having one transistor.one capacitor structure.

Figure 2:
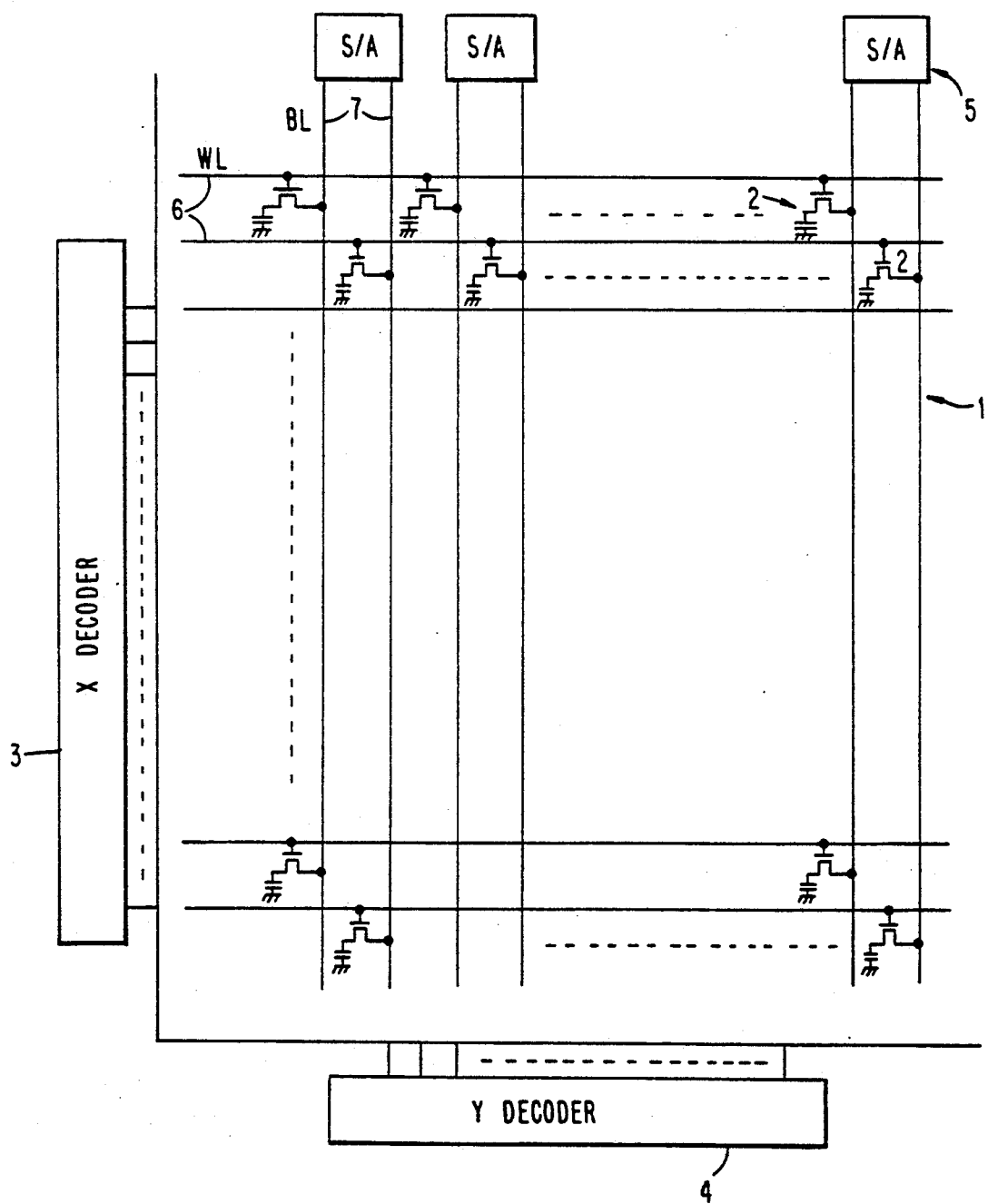
FIG. 2 is a block diagram showing the whole structure of a dynamic semiconductor memory device with the present invention applied thereto.

FIG. 2 is a block diagram showing the whole structure of the dynamic type semiconductor memory device.

Referring to FIG. 2, the dynamic type semiconductor memory device comprises an array 1 including a plurality of memory cells 2 serving as a memory portion, a X decoder 3 and a Y decoder 4 for selecting the address, and input/output interface portion 5 including a sense amplifier connected to an input/output buffer (not shown). Each of the memory cells 2 is connected to each intersection of a word line 6 connected to the X decoder 3 and a bit line 7 connected to the Y decoder 4, with the word line 6 and the bit line 7 constituting a matrix. The said array 1 is thus structured.

The operation will be hereinafter described. Upon receipt of externally applied row address signal and column address signal, a memory cell 2 is selected which is at the intersection of one word line 6 and one bit line 7 selected by the X decoder 3 and the Y decoder 4, and the information is read from or written to the memory cell 2 through the input/output interface portion 5 including the sense amplifier and through the input/output buffer.

Figure 1:
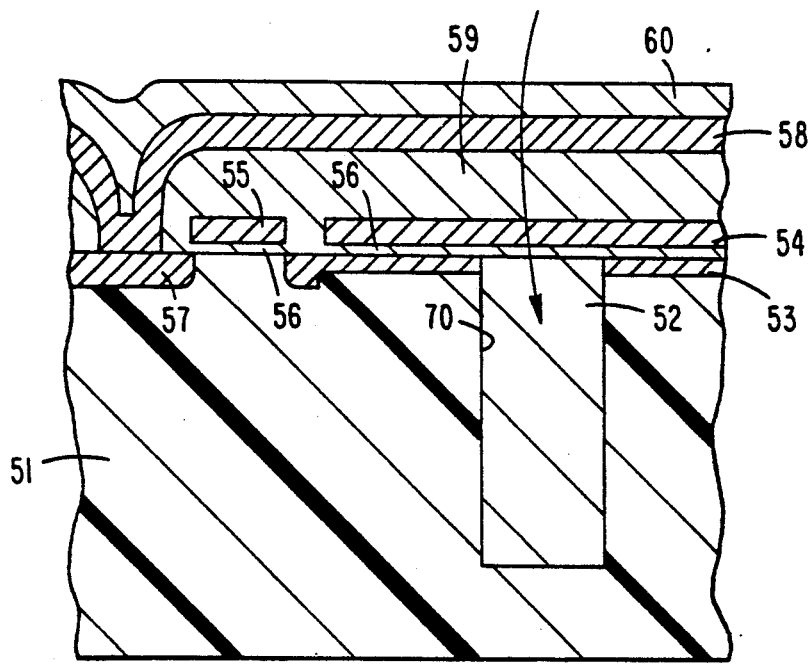
FIG. 1 is a cross sectional view of a conventional memory device.
Figure 3:
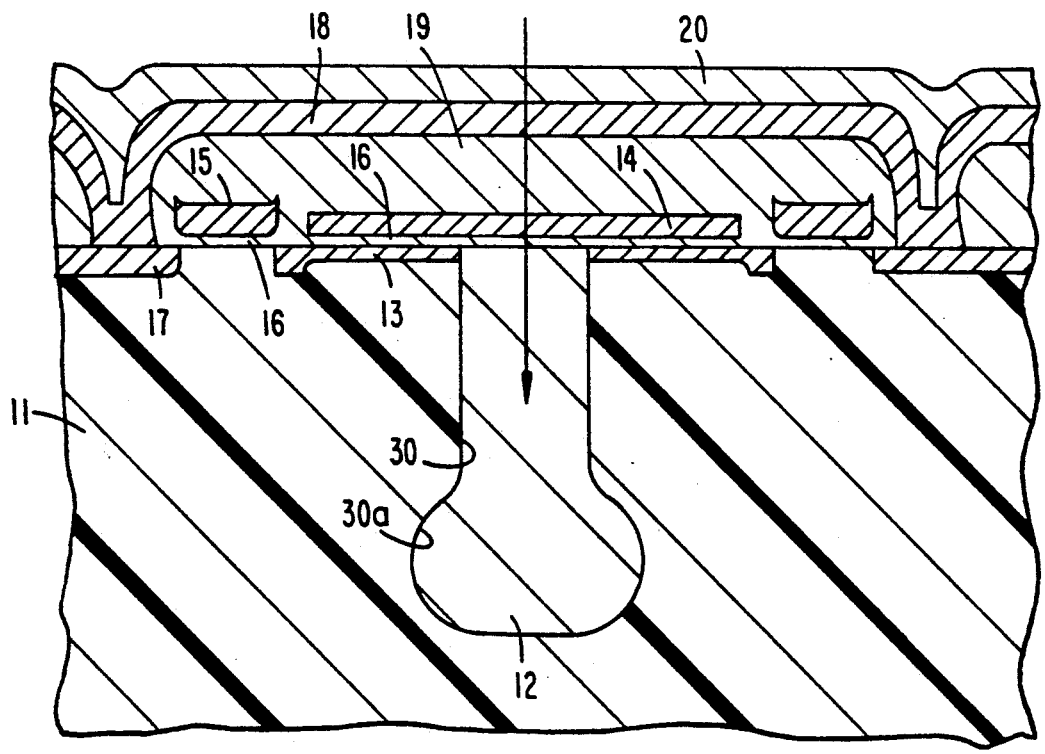
FIG. 3 is a cross sectional view showing the structure of the dynamic semiconductor memory device.

FIG. 3 is a cross sectional view of the above described memory cell 2.

Referring to the figure, a trench 30 is formed on a prescribed portion of the silicon substrate 11 and a silicon oxide film is filled in the trench 30 to form a trench isolating portion 12. An impurity diffusion layer 13 is formed adjacent to the trench isolating portion 12 and a capacitor plate electrode 14 is arranged thereon with a dielectric film 16 interposed therebetween. A transfer gate electrode 15 is arranged on the surface region of the silicon substrate 1 adjacent to the impurity diffusion layer 13 with the dielectric film 16 interposed therebetween. An impurity diffusion layer 17 is formed on the surface region of the silicon substrate 1 adjacent to the transfer gate electrode 15 and a metal wiring 18 is connected to the impurity diffusion layer 17. An interlayer insulating film 19 is formed between the metal wiring 18 and the capacitor plate electrode 4. A surface protection film 20 is formed as the uppermost layer.

In this embodiment, the width of the region in the bottom portion of the trench isolating portion 12, which is formed by filling an insulating material in the trench 30 on the silicon substrate 11 for isolating elements, is enlarged in both sides over the width of the upper portion of the trench 30. 30a denotes the enlarged portion.

In the semiconductor memory device, the trench isolating portion 12, which is enlarged to be wider than the bottom surface portion of the trench 30, serves as a barrier layer against the carriers generated by α rays in the silicon substrate 11, whereby the carriers are prevented from reaching the impurity diffusion layer 13 on the surface of the silicon substrate 11.

The method for manufacturing the semiconductor memory device of the embodiment shown in FIGS. 2 and 3 will be hereinafter described.

FIGS. 4A to 4I are cross sectional views showing the steps of manufacturing the semiconductor memory device of the present invention.

Figure 4A:
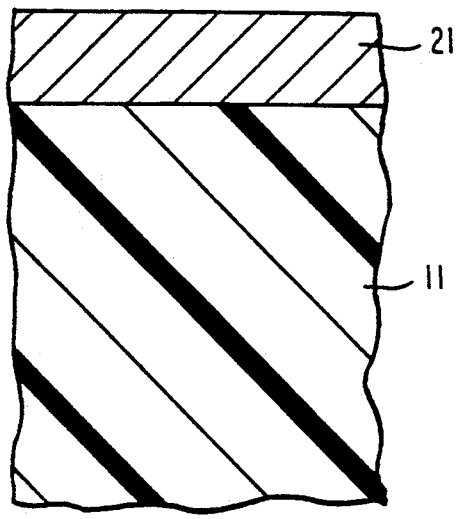
FIGS. 4A to 4I show, in the stepwise manner, the method for manufacturing the semiconductor memory device in accordance with the present method invention.
Figure 4B:
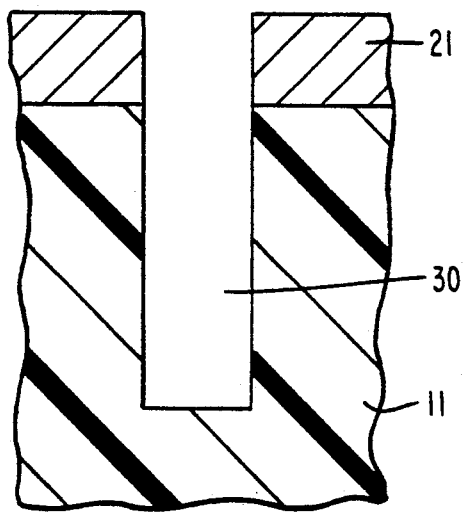
Figure 4C:
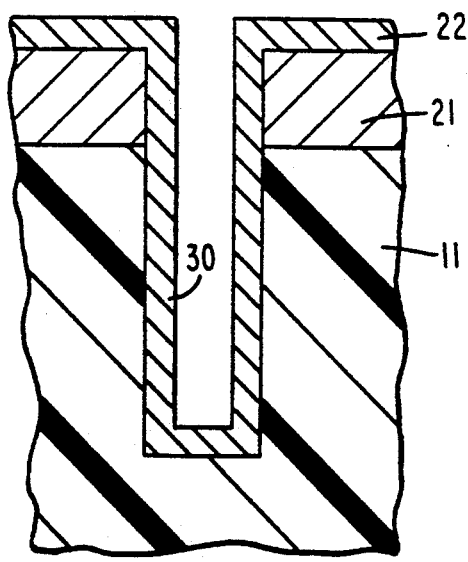
Figure 4D:
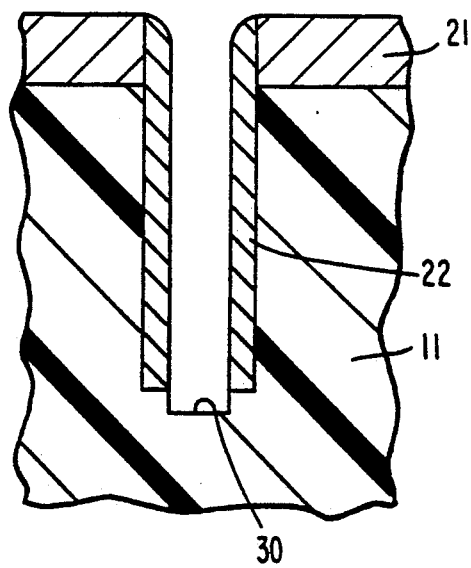
Figure 4E:
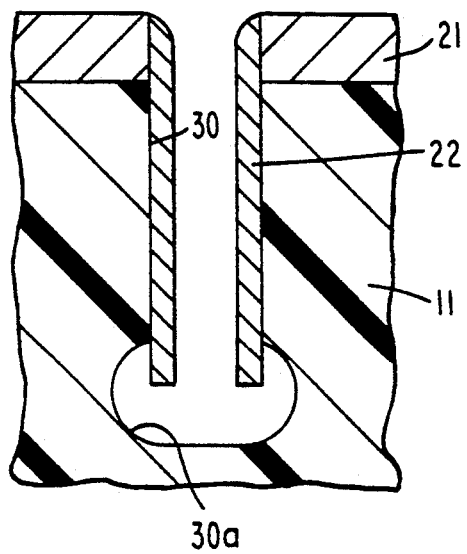
Figure 4F:
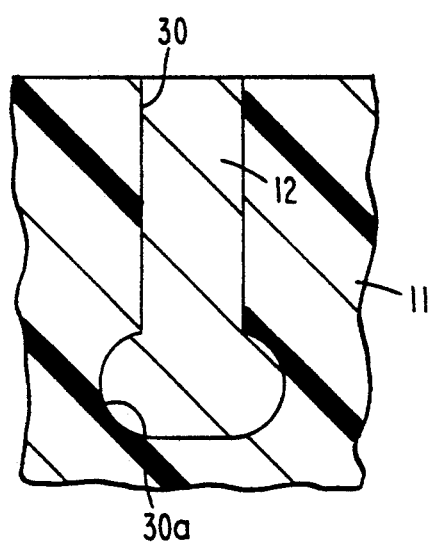

First, as shown in FIG. 4A, a thick silicon oxide film 21 is formed on the silicon substrate 11. Then, it is patterned after the process of photolithography and a trench 30 is formed on the silicon substrate 11 by anisotropic etching such as RIE (Reactive Ion Etching) as shown in FIG. 4B. A thick silicon oxide film 22 is formed on the entire exposed surface of the silicon substrate 11 as shown in FIG. 4C and, as shown in FIG. 4D, the silicon oxide film 22 is etched in the direction vertical to the surface of the silicon substrate 11 by anisotropic etching such as RIE. Consequently, only the silicon oxide film 22 on the side wall surface of the trench 30 is left unetched and only that surface of the silicon substrate 11 on the bottom surface is exposed in the trench 30. The flat portion of the silicon substrate 11 is covered with the thick silicon oxide film 21 which served as the etching mask in forming the trench 30 in the silicon substrate 11. Thereafter, as shown in FIG.

4E, the silicon substrate 11 in the bottom region of the trench 30 is etched by isotropic etching. Since the silicon substrate 11 is isotropically etched, it is etched not only in the vertical direction but also in the horizontal direction to the surface of the silicon substrate 11. After the silicon oxide films 21 and 22 are removed, an insulating material such as silicon oxide film, policrystalline silicon or the like is filled in the space in the trench by etch back method or the like to form a trench isolating portion 12.

Figure 4G:
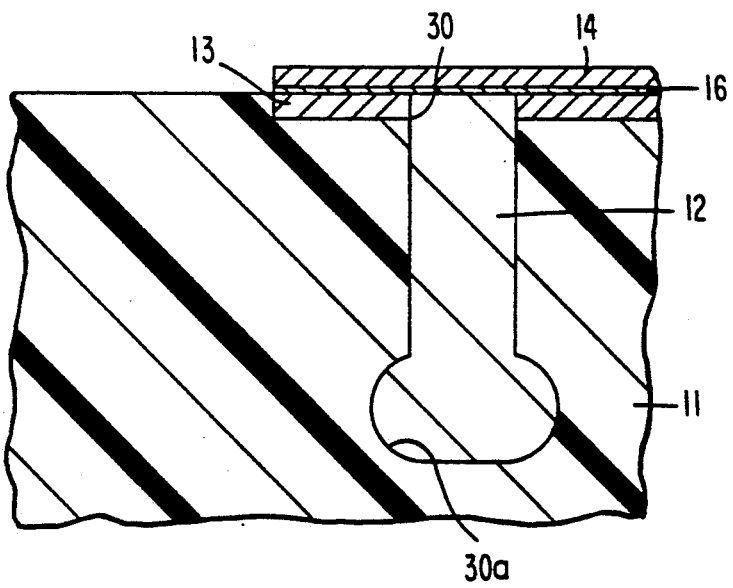
Figure 4H:
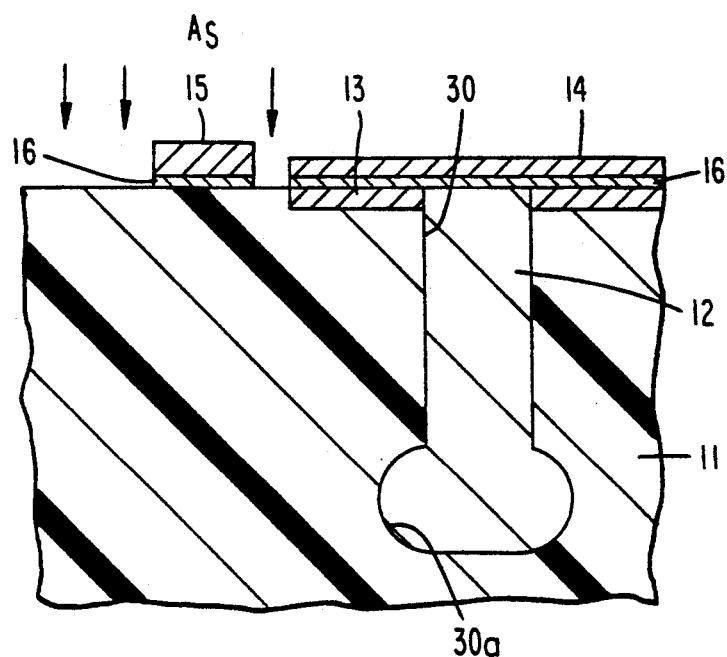

After that, the impurity diffusion layer 13 is formed adjacent to the trench isolating portion 12 at the main surface portion, while a resist (not shown) is used as a mask for ion implantation. A capacitor dielectric film 16 is formed on the impurity diffusion layer 13 and on the trench isolating portion 12. A capacitor plate electrode 14 is formed on the capacitor dielectric film 16 (FIG. 4G). A gate dielectric film 16 is formed spaced apart from the capacitor plate electrode 14 on the main surface of the silicon substrate 11. A transfer gate electrode 15 is formed on the gate dielectric film 16. Arsenic ion implantation is carried out on the main surface of the silicon substrate 11 using the capacitor plate electrode 14 and the transfer gate electrode 15 as masks. The ion implantation is carried out from above vertical to the main surface (FIG. 4H). Consequently, the impurity diffused regions 13a and 17 which are to be the source and the drain are formed on the prescribed regions on the main surface of the silicon substrate 11. This impurity diffusion region 13a is connected to the impurity diffusion electrode 13.

Figure 4I:
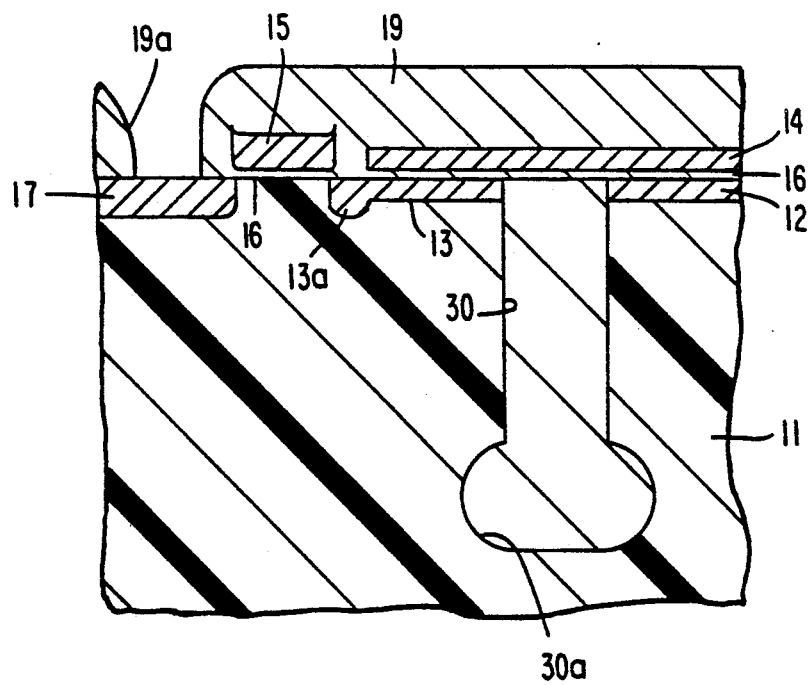

The main surface of the silicon substrate 11 is covered with an interlayer insulating film 19. A contact hole 19a is formed at a prescribed position (FIG. 4I). A metal wiring 18 is formed on the interlayer insulating film 19 and is connected to the impurity diffusion layer 17 through a contact hole 19a. The metal wiring 18 is a bit line 7 shown in FIG. 2. The metal wiring 18 is covered with a surface protection film 20.

The foregoing shows one example of the method for manufacturing the semiconductor memory device utilizing the present invention. Two memory cells are separated from each other by the trench isolating portion 12.

Embodiment 2

Figure 5:
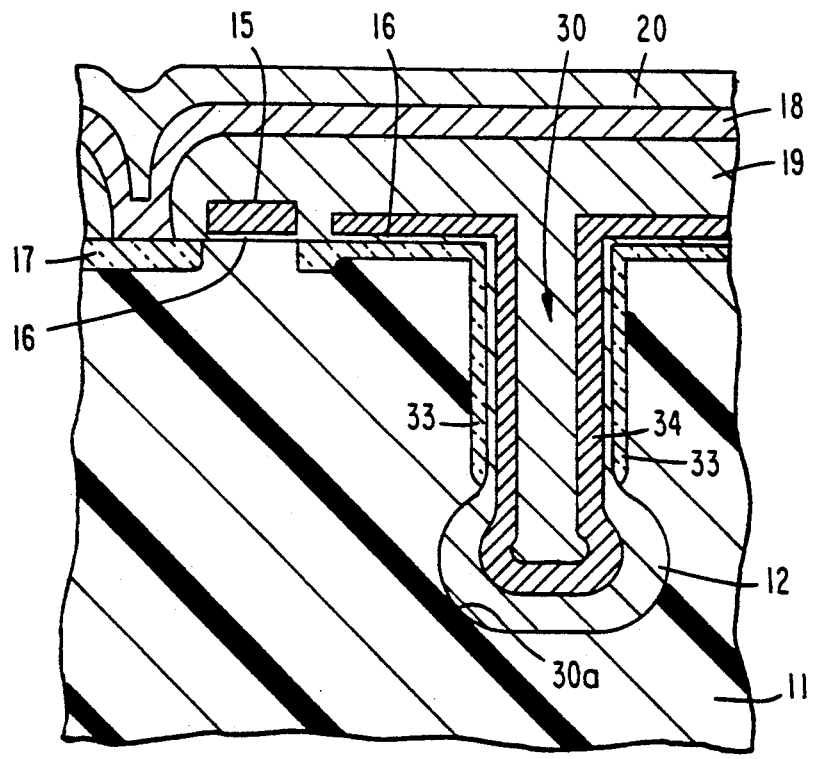
FIG. 5 is a partial cross sectional view of another embodiment.

The structure shown in FIG. 5 may be employed instead of the structure shown in FIG. 3.

Referring to FIG. 5, an impurity diffusion layer 33 is formed on the side wall portion of the trench 30 and portions of the surface of the semiconductor substrate 11 which is continued to the side wall portion. In addition, a capacitor plate electrode 34 is arranged on the impurity diffusion layer 33 with a dielectric film 16 interposed therebetween. The capacitor plate electrode 34 extends along the impurity diffusion layer 33 and, in addition, it extends along the side wall portion and the bottom surface portion of the trench 30. The interlayer protection film 19 is also filled in the trench 30 corresponding to the shape of the capacitor plate electrode 34. Correspondingly, the silicon oxide film filled in the trench 30 is formed in a thin layer shape along the side wall surface of the trench 30 and the side wall portion of the trench 30 is employed as a capacitor. In the enlarged portion 30a, the embedded silicon oxide film is relatively thick, and this portion serves as the region for isolating elements.

In this case also, the enlarged portion 30a serves as the barrier layer against the carriers generated by the α ray in the silicon substrate 11, whereby the carriers are prevented from reaching the impurity diffusion layer 33.

The method for manufacturing the semiconductor memory device in accordance with the embodiment of FIG. 5 will be hereinafter described.

FIGS. 6A to 6F are cross sectional views showing the steps of manufacturing the semiconductor memory device.

Figure 6A:
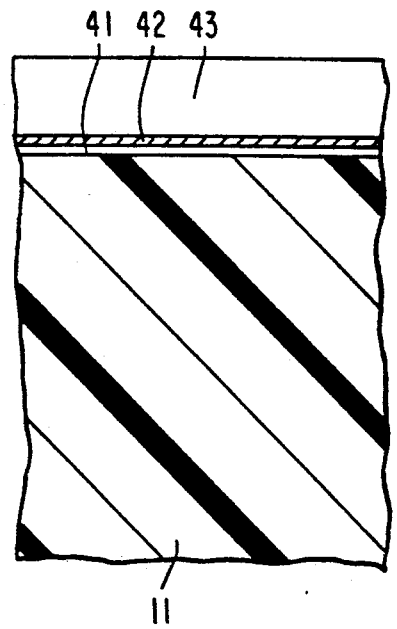
FIGS. 6A to 6F show the method for manufacturing the embodiment of FIG. 5.
Figure 6B:
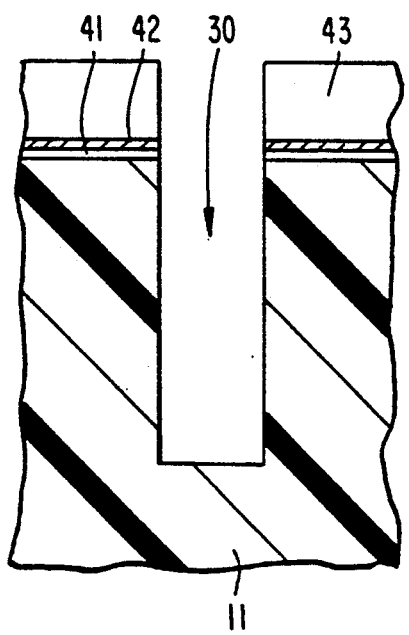

First, as shown in FIG. 6A, a thin silicon oxide film 41 is formed on a single crystal silicon substrate 11 by thermal oxidation and a silicon nitride film 42 which will be the oxide mask is formed on the silicon oxide film 41. Thereafter, a thick silicon oxide film 43 is formed on the silicon nitride film 42. Subsequently, the silicon oxide film 43 is patterned by the process of photolithography and a trench 30 is formed in the silicon substrate 11 by anisotropic etching such as reactive ion etching as shown in FIG. 6B.

Figure 6C:
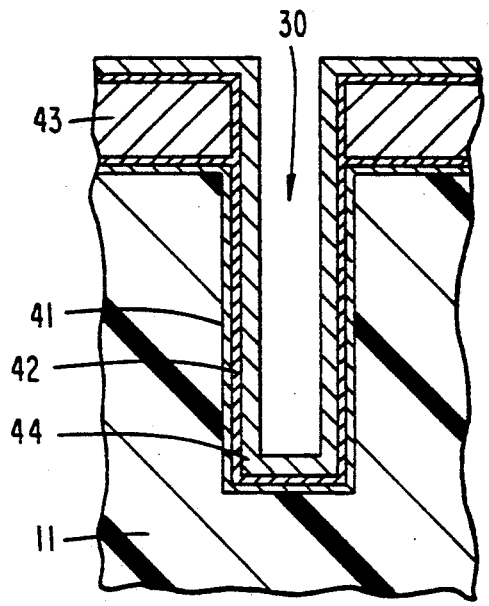
Figure 6D:
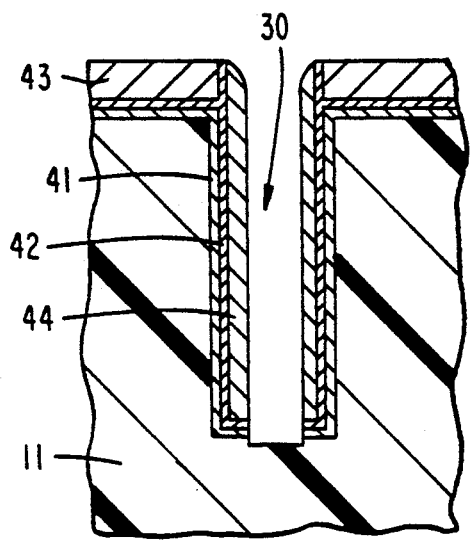

Thereafter, as shown in FIG. 6C, a thin silicon oxide film 41 is formed on the side wall portion and the bottom surface portion of the trench 30 by the thermal oxidation. A silicon nitride film 42 which will be the oxide mask is formed on the silicon oxide film 41. A silicon oxide film 44 which will be the etching mask on the side wall portion of the trench 30 is formed on the silicon nitride film 42. Thereafter, as shown in FIG. 6D, the silicon oxide film 44, silicon nitride film 42, silicon oxide film 41 and the silicon substrate 11 are etched in the vertical direction by anisotropic etching such as reactive ion etching. Now, the silicon nitride film 42 which is formed on the side wall portion of the trench 30 remains being covered with the silicon oxide film 44 which serves as the etching mask, and only the silicon nitride film 42 formed on the bottom surface portion of the trench 30 is removed. After these steps, the silicon nitride films 42 formed on the side wall portion of the trench 30 and on the region of the surface of the semiconductor substrate 1 are respectively masked with the silicon oxide film 43 and 44.

Figure 6E:
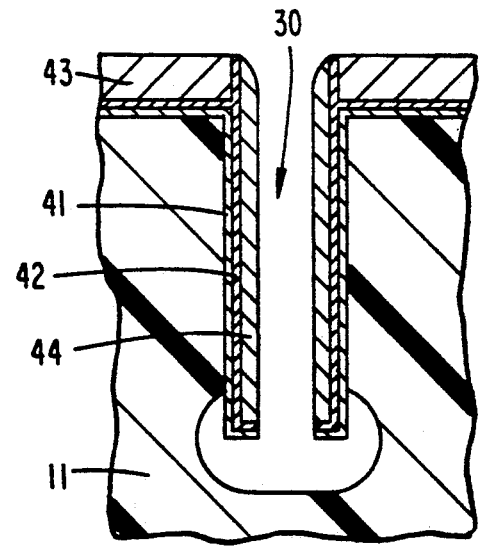
Figure 6F:
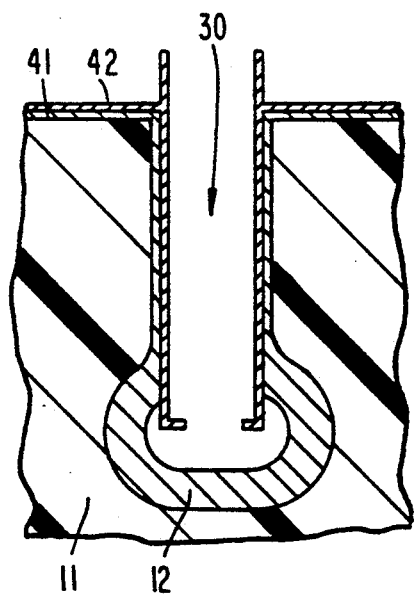

Then, as shown in FIG. 6E, the silicon substrate 11 in the region of the bottom portion of the trench 30 is etched by isotropic etching. Since the silicon substrate 11 is isotropically etched, it is etched not only in the vertical direction but also in the horizontal direction to the surface of the substrate. As shown in FIG. 6F, after the silicon oxide film 43 and 44 are removed, a region for isolating elements 12 formed of thick silicon oxide film is formed on the region of the bottom portion of the trench 30 by thermal oxidation. Thereafter, the silicon nitride film 42 which served as the oxide mask is removed. After the prescribed steps as in the embodiment 1, the semiconductor memory device shown in FIG. 5 is provided.

Figure 7:
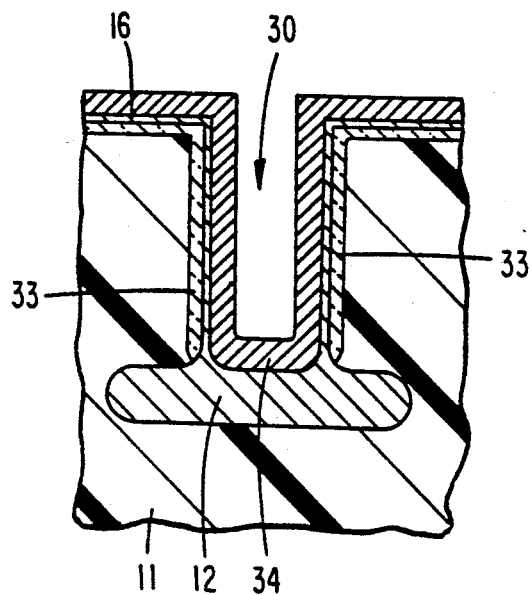
FIG. 7 is a partial cross sectional view of a further embodiment.

Other Embodiments (a) FIG. 7 is a cross sectional view showing another embodiment of the present invention. The semiconductor memory device of the embodiment has its enlarged portion 30a formed in the region of the bottom portion of the trench 30 enlarged only in the direction parallel to the surface of the semiconductor substrate 1.

Figure 8:
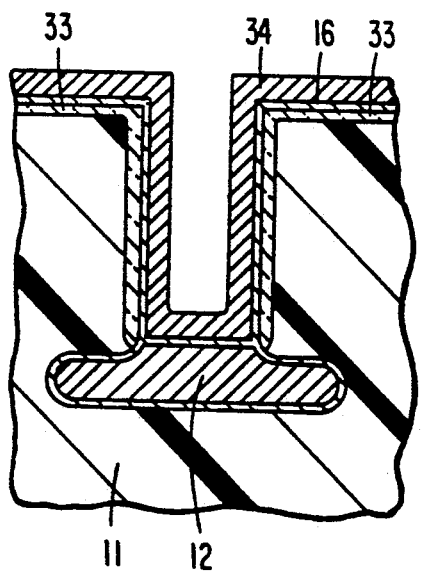
FIG. 8 is a partial cross sectional view of a still further embodiment.

(b) FIG. 8 is a cross sectional view showing a further embodiment of the present invention. In this embodiment, the region 12 for isolating elements formed of thick silicon oxide film in the embodiment shown in FIG. 7 is formed of an insulating polycrystalline silicon.

(c) The region 12 for isolating elements may be formed in a region in a portion of the enlarged portion 30a. In this case also, the region 12 for isolating elements should be enlarged in the direction parallel to the surface of the semiconductor substrate 11 over the width of the bottom surface portion.

(d) Although the description was given of a case in which the present invention is applied to the MIS type random access memory device of one transistor.one capacitor structure in the above described embodiment, the present invention may be applied to the semiconductor logic circuit and to the arithmetic circuit to provide the same effect as in the above described embodiment.

As described above, in the semiconductor device in accordance with the present invention, the region in the bottom portion of the trench for isolating elements formed in the semiconductor substrate is enlarged in both sides over the width of said trench in the direction parallel to the surface of the semiconductor substrate, so that the enlarged region for isolation serves as a barrier layer against $\alpha$ rays, preventing the arrival of carriers at the active region formed on the surface of the semiconductor substrate. Therefore, malfunctions due to the carriers can be avoided and a semiconductor device can be obtained which is stable against soft errors induced by $\alpha$ rays.

According to the method for manufacturing the semiconductor device in accordance with the present invention, only the region in the bottom portion of the trench can be enlarged, thereby the aimed semiconductor device can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a semiconductor device having a trench, comprising the steps of:
   forming a first silicon oxide film on a semiconductor substrate,
   etching a trench in said semiconductor substrate with the silicon oxide film used as an etching mask,
   forming a second silicon oxide film on the entire exposed surface of said semiconductor substrate and said first silicon oxide film,
   anisotropically etching said second silicon oxide film until the second silicon oxide film remains only on the side walls of said trench,
   enlarging the trench by etching the semiconductor substrate, previously exposed only on a bottom surface of said trench by an isotropic etching process, to enlarge the width of a bottom portion of said trench,
   wherein said second oxide film is formed on the side wall portion and the bottom surface portion of said trench, forming a silicon nitride film which will be the oxidation mask on said second oxide film and comprising the further step of forming, a further silicon oxide film which will be the etching mask on the side wall portion of the trench formed on the silicon nitride film.

2. The method of claim 1, which further comprises the steps of forming an impurity diffusion layer along the trench side wall and which impurity diffusion layer has downwardly depending portions terminating above the enlarged bottom portion of the trench; forming a capacitor dielectric film on said impurity diffusion layer, and forming a capacitor plate electrode on said capacitor dielectric film.

3. A method for manufacturing a semiconductor device having a trench, comprising the steps of:
   forming a first silicon oxide film on a semiconductor substrate,
   etching a trench in said semiconductor substrate with the silicon oxide film used as an etching mask,
   forming a second silicon oxide film on the entire exposed surface of said semiconductor substrate and said first silicon oxide film,
   anisotropically etching said second silicon oxide film until the second silicon oxide film remains only on the side walls of said trench,
   enlarging the trench by etching the semiconductor substrate, previously exposed only on a bottom surface of said trench by an isotropic etching process, to enlarge the width of a bottom portion of said trench, and which further comprises the step of forming a region for isolation by forming a region for isolating elements of thick silicon oxide film on the bottom portion region of the trench by thermal oxidation.

4. The method of claim 3, which further comprises the steps of forming an impurity diffusion layer along the trench side wall and which impurity diffusion layer has downwardly depending portions terminating above the enlarged bottom portion of the trench; forming a capacitor dielectric film on said impurity diffusion layer, and forming a capacitor plate electrode on said capacitor dielectric film.

5. A method for manufacturing a semiconductor device having a trench, comprising the steps of:
   forming a first silicon oxide film on a semiconductor substrate,
   etching a trench in said semiconductor substrate with the silicon oxide film used as an etching mask,
   forming a second silicon oxide film on the entire exposed surface of said semiconductor substrate and said first silicon oxide film,
   anisotropically etching said second silicon oxide film until the second silicon oxide film remains only on side walls of said trench,
   enlarging the trench by etching the semiconductor substrate, previously exposed only on a bottom surface of said trench by an isotropic etching process, to enlarge the width of a bottom portion of said trench, wherein said step of forming a second oxide film comprises the steps of forming a thin silicon oxide film on the side wall portion and the bottom surface portion of said trench by thermal oxidation, forming a silicon nitride film which will be the oxide mask on said silicon oxide film, and forming a further silicon oxide film which will be the etching mask on the side wall portion of the trench on the silicon nitride film wherein said step of forming a first oxide film comprises the steps of forming a thin silicon oxide film on the semiconductor substrate by thermal oxidation, forming a silicon nitride film which will be the oxide mask on the thin silicon oxide film, forming a thick silicon oxide film on said silicon nitride film and patterning the thick silicon oxide film by photolithography.

6. A method for manufacturing a semiconductor device according to claim 5, which further comprises the step of forming a region for isolation by forming a region for isolating elements formed of thick silicon oxide film on the bottom portion region of the trench by thermal oxidation after removing said silicon oxide film.

* * * * *